United States Patent [19]
Tachimoto et al.

[11] Patent Number: 4,864,226
[45] Date of Patent: Sep. 5, 1989

[54] METER WITH SYNTHESIZED VOICE READOUT

[76] Inventors: Minoru Tachimoto, 4-10 Sekido, Tama-shi Tokyo; Isao Sofue, 2-9-11 Yokoyama, Sagamihara-shi, Kanagawa Prefectura, both of Japan

[21] Appl. No.: 88,042

[22] Filed: Aug. 21, 1987

[30] Foreign Application Priority Data

Aug. 21, 1986 [JP] Japan .......................... 61-126530[U]

[51] Int. Cl.⁴ .................... G01R 19/00; G01R 15/08; G06F 3/16
[52] U.S. Cl. .............................. 324/157; 324/99 D; 324/115; 364/710.12
[58] Field of Search ..................... 324/157, 99 D, 115, 324/120, 72.5; 364/710

[56] References Cited

U.S. PATENT DOCUMENTS

| | | | |
|---|---|---|---|
| 3,081,431 | 3/1963 | Werner et al. | 324/157 |
| 3,828,252 | 8/1974 | Wolff | 324/157 |
| 4,272,310 | 2/1988 | Hashimoto et al. | 324/157 |

OTHER PUBLICATIONS

Wagner, W. S.; "Talking Meter . . . "; Electronics; Dec. 20, 1979; pp. 123–124.
Wagner, W. S.; "Digital Voltmeter . . . "; Electronics; Mar. 29, 1979, pp. 120–122.

Primary Examiner—Ernest F. Karlsen

[57] ABSTRACT

A meter is provided which visually displays and audibly announces values which are detected. A switch is manually operated to maintain the visual representation until the audible announcement has been generated.

15 Claims, 2 Drawing Sheets

METER WITH SYNTHESIZED VOICE READOUT

FIELD OF THE INVENTION

This invention relates to meters which measure voltage, current, and electrical resistance based on a measurement signal input from a measurement probe and which indicate the measured value in analog or digital form.

BACKGROUND OF THE INVENTION

Meters for making electrical measurements by contacting points to be measured with measurement probes are well-known. An example of such a known meter is a digital multimeter. Conventionally these meters indicate the measured value on either an analog or a digital visual display while the measurement probes are in contact with the points to be measured. Consequently, they require that the user view the display in order to read the measured value while the measurement probes are in contact with points to be measured.

In recent years, the electronics industry has tended toward high-density electronic circuits. In such circuits the electrical parts and connections are physically mounted close together to reduce the overall size of the circuit. These high density circuits often require electrical testing by measuring the voltages, currents or resistances of various points in the circuit with a meter to verify proper operation. The physically small size of the parts requires test personnel to accurately manipulate the meter's measurement probes to make contact with portions of the circuit. This manipulation is often difficult even if the operator is viewing the meter probes and the measurement point at the time when contact is made.

However, viewing the display of a conventional meter requires the operator to take his eyes off the measurement point in the electronic circuit. Sometimes the operator must physically move his head to view the measured value. Often in viewing the display after placing the meter probes on the points to be measured, the probe slips off the measurement point before the display is viewed thus preventing an accurate measurement. Therefore, eficency and accuracy in the measurement operation is reduced. The higher the number of the measured points, the greater the influence.

In addition, meters provided with a analog or digital visual displays have the drawback that it is difficult to read measured values if there is insufficient illumination.

Accordingly, it is an object of this invention to provide a meter which allows the operator to read the measured value without taking his eyes off the measurement point.

It is a further object of the invention to provide a meter which allows audible readout of the measured value.

It is yet another object of the invention to provide a meter which allows visual readout of the measured value in addition to audible readout.

SUMMARY OF THE INVENTION

The foregoing problems are solved and the foregoing objects are achieved in accordance with one embodiment of the invention in which measured value is converted into an audible signal by means of a voice synthesizer. A conventional visual display is also used.

In order to force the visual and audible displays to agree, thereby insuring accurate readings, the meter is provided with a switch located within easy reach of the operator which initiates conversion of the measured value into an audible signal. During the conversion time, the meter circuits are held to prevent any change in the visual display.

DETAILED DESCRIPTION OF THE PREFERRED EMBODIMENT

Figure 1:
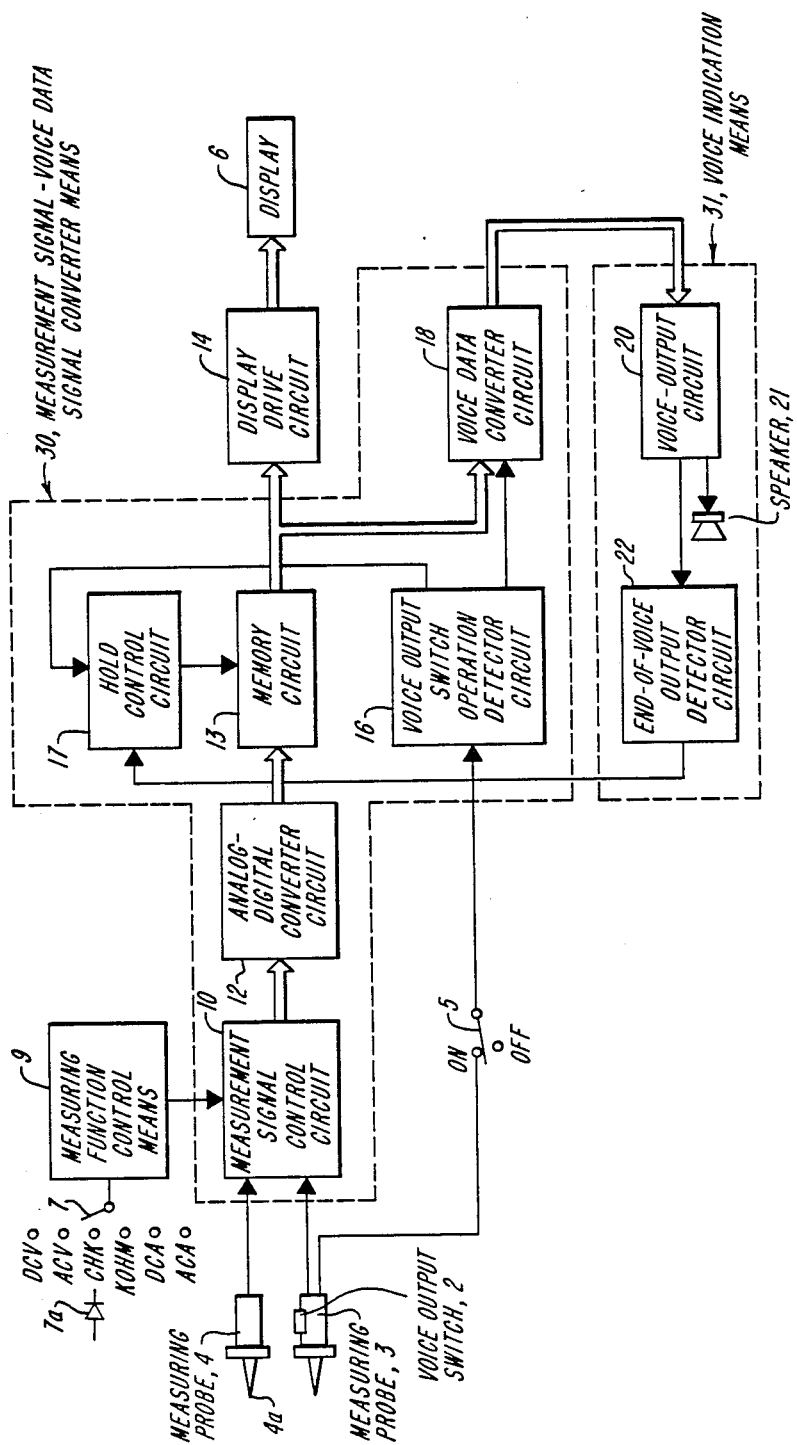
FIG. 1 is a block diagram illustrating in electrical schematic form an illustrative embodiment of the invention.
Figure 2:
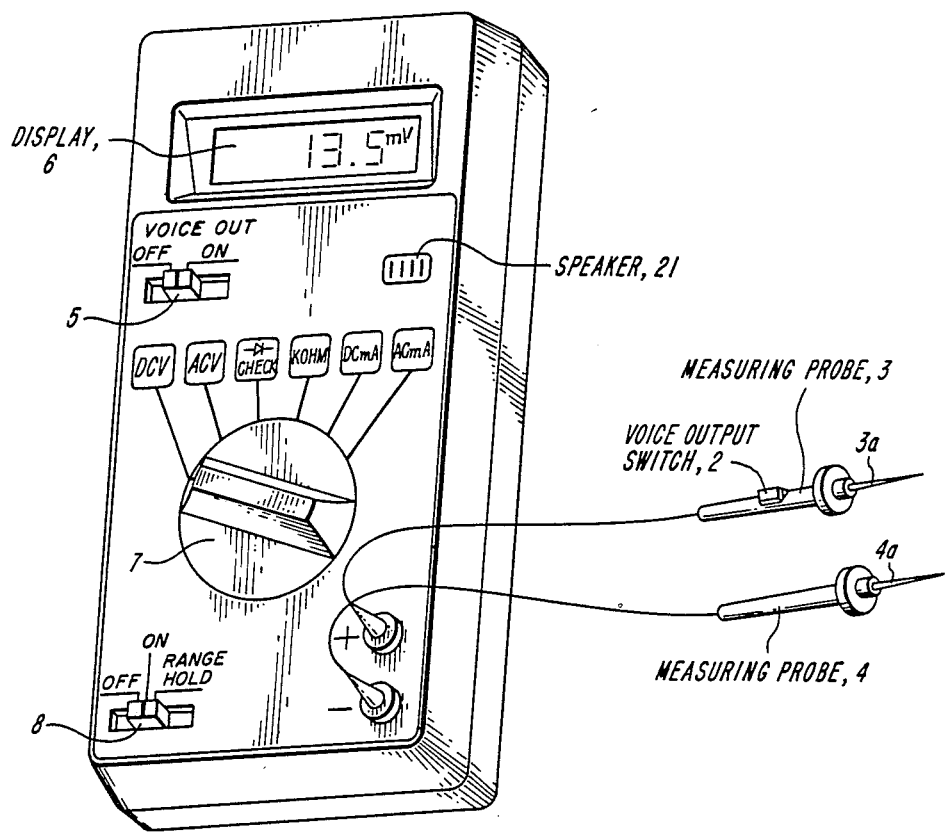
FIG. 2 is a perspective view illustrating a typical appearance of a meter utilizing the invention.

Referring to FIGS. 1 and 2, in an embodiment of the invention in a digital multimeter, a meter 1 is shown equipped with measurement probes 3 and 4, for contacting a point to be measured. When the probes are touched to the measurement point, the signal to be measured is conveyed by cables in a conventional manner to a conversion circuit including measurement signal control circuit 10, analog-digital convertor circuit 12 and memory circuit 13. This latter circuitry converts the value into a signal which drives a display 6 by means of display drive circuit 14.

In accordance with one aspect of the invention, a voice output switch 2 is provided on one of the probes, for example probe 3, which switch can be pressed by the meter operator when it is desired that a measured value be converted into a voice signal. In order to do this conversion, measured signal-voice data signal conversion circuit 30 is provided for converting the measured signal available at the time of the operation of voice output switch 2 into a voice signal. The voice signal is provided to a voice indication circuit 31 which generates synthesized voice indicating the value of the measured value.

Thus, the meter with the arrangement stated above not only indicates the measured value on display 6, but also can audibly announce the measured value on speaker 21. The audio announcement is obtained by simply pressing voice output switch 2 which is conveniently located by the operator's hand. The location of the switch 2 insures a simple and secure measurement operation, lessening the operator's effort. Furthermore, a meter utilizing the invention can be used without hindrance in an environment where viewing the display is difficult due to poor illumination or other problems.

More particularly, measurement probes 3 and 4 have measurement terminals 3a and 4a on the tip side which are connected by wires to measurement signal control circuit 10. One probe, for example, probe 3, is an active probe used to measure an electrical signal; the other probe, 4, is used to connect the meter circuit to a reference point in the measured circuit. Switch 2 is a voice output switch provided on one measurement probe. Generally, switch 2 will be located on the active probe 3, but may also be located on the reference probe, 4. Switch 2 may advantageously be a push-button switch, but a slide switch or touch switch or other conventional switch arrangement can also be used.

An additional switch 5 may also be provided as an on/off switch to enable or disable the voice output switch 2 during normal operation.

Multiple pole switch 7 is a conventional mode selector switch for switching among the various measuring modes such as voltage, current and resistance. In a known manner, switch 7 provides a reference signal by means of signal diodes, such as diode 7a, to circuit 9 for selecting a particular measuring mode. In accordance with the position of switch 7, circuit 9 generates a control signal which is, in turn, provided to measurement signal control circuit 10. Circuit 10 is also a conventional circuit which contains signal ranging, scaling and conversion circuitry. In a known manner, circuit 10, in accordance with the mode set by selector switch 7 and the nature and size of the measured signal sensed by probes 3 and 4, makes an appropriate signal conversion to convert the measured signal into a standard internal analog signal which the meter will display. The value of the internal signal is, of course, directly related to the measured signal in a known way.

Circuit 12 is a known analog-digital convertor circuit which converts the internal analog signal received from the measuring signal controller circuit 10, into a digital measurement signal.

Normally, the output of convertor circuit 12 would be used to directly drive the display drive circuit 14. However, in accordance with another aspect of the invention, memory circuit 13 temporarily stores the digital measurement signal generated by conversion circuit 12. Memory 13 updates the stored data each time a new signal is converted. As will be discussed in detail below, memory circuit 13 is used to temporarily hold the digital measurement signal in response to a hold signal generated by hold circuit 17. This temporary storage allows the meter circuitry to insure that the visual and audible displays correspond.

The digital measurement signal held in memory 13 is provided to display drive circuit 14 which generates, in a known manner, a drive signal for displaying the measured value on conventional display 6. Display 6 may, for example, by a liquid-crystal display. With the exception of the memory 13 and switch 2, the above described components are conventional and, accordingly, will not be discussed further.

The voice detection and conversion circuit consists of voice output switch detector circuit 16, voice data convertor circuit 18, hold circuit 17, memory circuit 13 and voice indicator circuit 31. Voice output switch operation detector circuit 16 detects the operation of voice output switch 2. This may be accomplished when switch 2 is pressed with the control switch 5 set to "ON" by detecting either a voltage or ground signal which is provided to probe 3 and passed through switches 2 and 5 to circuit 16. The switch closure detector circuit 16 is connected to a hold control circuit 17 for controlling the operation of the memory circuit 13 and the display drive circuit 14. A voice data convertor circuit 18, also under control of detector circuit 16, first converts the digital measurement signals from memory circuit 13 into a serial data stream and then converts the serial data stream into digital voice data.

The digital voice data control a voice output circuit 20 which synthesizes an electronic voice signal from synthesized word data that was previously stored in output circuit 20. The electronic voice signal is provided to a speaker 21 which generates the audible voice signal that announces the measured value.

The electronic voice signal is provided to an end of voice output detector circuit 22 which detects the end of the synthesized voice output from voice output circuit 20. Detector circuit 22, in turn, controls hold circuit 17 to allow memory 13 to update the stored measurement data for another measurement cycle. A power switch 8, shown in FIG. 2, is provided to turn the operation of the circuitry on and off.

Operation of the illustrative voice conversion circuitry proceeds as follows. When voice output switch 2 is operated with voice output ON/OFF switch 5 turned "ON" and with the measuring probes 3 and 4 in contact with the measurement points, the voice output switch operation detector circuit 16 detects the closure of switch 2 and sends a closure detected signal to hold control circuit 17.

Upon reception of the closure detected signal, hold control circuit 17 generates a "hold" signal which is provided to memory circuit 13. In response to the hold signal, memory 13 temporarily stores the digital measurement signal generated by analog-digital conversion circuit 12. After receiving a hold signal from hold circuit 17, memory 13 suspends updating of the stored data until a "hold release" signal is generated by hold circuit 17, as will be described below. Therefore, when voice output switch 2 is closed, the digital measurement signal that represented the measured value at the time of the switch closure is held in memory 13. Accordingly, display 6 will continue to display the measured value which occurred when the voice output switch 2 was closed until a hold release signal is generated. The holding of the measured value allows time for the voice conversion to take place so that the audible and visual display will correspond.

Upon receipt of the closure detected signal from circuit 16, voice data converter circuit 18 retrieves the digital measurement data stored in memory 13. The data is generally retrieved in parallel form and must be converted into serial form for generation of a synthesized voice signal. This conversion is performed in a conventional fashion by voice data converter circuit 18.

The serial digital data stream generated by voice data converter circuit 18 is fed into voice output circuit 20. Voice output circuit 20 may illustratively be a well-known voice synthesizer semiconductor chip which contains an internal memory that stores a plurality of electronic signal sets that generate predetermined words. Voice output circuit 20, in response to the incoming serial data stream, refers to the stored word signals that are stored in advance of the meter operation, retrieves the stored words that correspond to the voice data, and generates electronic signals representing spoken words which voice announce the measured value. The electronic signals are converted into an audible signal by speaker 21.

The electronic voice output signals are also provided to an end-of-voice output detector circuit 22. This is a conventional circuit which examines the electronic signals and determines when the voice output has ceased. This detection function may be performed in a known way by filtering and timing circuits. When the end-of-voice output detector circuit detects that the voice announcement has ceased, it generates a release signal that is provided to hold circuit 17.

Upon reception of the release signal, hold circuit 17 generates a hold release signal to memory 13. The hold release signal allows memory 13 to begin updating the stored signal with new measurement signals as each signal is received and converted. Thus, the output display 6 is allowed to change along with the input as in conventional meter operation until the next closure of switch 2.

The arrangement of meter circuitry as disclosed above is for convenience only and any of various other equivalent arrangements can, of course, be employed. For example, although, in the embodiment described above, the measurement signal-voice data signal converter circuit 30 is disclosed as comprising a plurality of separate circuits 10, 12, 13, 16 and 18 and the voice indication circuitry 31 is disclosed as comprising separate circuits 20 and 22, this is only a single embodiment. It will be immediately obvious to those skilled in the art that the same functions could be obtained by constructing the above-described embodiment with a suitably programmed microcomputer and a voice-synthesizer integrated circuit both of which are presently commercially available.

Also, in an alternative embodiment, the hold control circuit 17 can be eliminated and the meter circuitry changed so that an audible readout is made only while switch 2 is closed.

What is claimed is:

1. In a meter which measures electrical signals by means of measurement probes which are placed on points to be measured and which has a display which visually displays the measured values, the improvement comprising:
    manually operable means to indicate when a measured value should be audibly announced,
    means controlled by said manually operable means and responsive to the measured value which was available when said manually operable means was operated for converting said measured value into electronic signals representative of spoken words that announce the value of said measured signal,
    means responsive to said electronic signals for generating an audible announcement indicating the value of said measured signal, and
    means responsive to an operation of said manually operable means for maintaining a display of the measured value which was available when said manually operable means was operated on said display until said audible announcement has been generated.

2. In a meter, the improvement as set forth in claim 1 wherein said manually operable means is located on one of said measurement probes.

3. In a meter, the improvement as set forth in claim 1 wherein said conversion means comprises:
    means responsive to said measured value for temporarily storing said measured signal, and
    means responsive to said stored signal and to the operation of said manually operable means for converting said stored signal into electronic signals.

4. In a meter, the improvement as set forth in claim 3 wherein said storing means comprises:
    a hold control circuit responsive to the operation of said manually operable means for generating a hold signal when said manually operable means is operated;
    a memory circuit responsive to said measured value for temporarily storing said measured value, said memory circuit periodically updating said stored measured value with a the current value of the measured signal, said memory circuit being responsive to said hold signal for discontinuing the periodic updating of said stored measured value.

5. In a meter, the improvement as set forth in claim 4 further comprising means responsive to said electronic signals for generating a release signal when said audible announcement has ceased, and wherein said hold control circuit is responsive to said release signal for generating a hold release signal, said memory circuit being responsive to said hold release signal for resuming periodic updating of said stored measured value.

6. In a meter, the improvement as set forth in claim 4 wherein said converting means comprises a voice circuit responsive to said stored measured value and responsive to spoken word information previously stored in said voice circuit for synthesizing electronic signals representing a spoken word conveying the value of said stored measured value.

7. In a meter, the improvement as set forth in claim 4 wherein said converting means further comprises an analog-to-digital convertor circuit responsive to said measured value for converting said measured value into a digital signal and wherein said memory circuit stores said digital signals.

8. A meter for measuring electrical signals by means of measurement probes which are placed on points to be measured comprising:
    manually operable means for generating a selection signal which selects the attributes of the signal to be measured;
    means responsive to said selection signal and to said electrical signals detected by said probes for visually displaying the measured values;
    second manually operable means to indicate when a measured value should be audibly announced,
    means controlled by said second manually operable means and responsive to the measured value which was available when said second manually operable means was operated for converting said measured value into electronic signals representative of spoken words that announce the value of said measured signal,
    means responsive to said electronic signals for generating an audible announcement indicating the value of said measured signal, and
    means responsive to an operation of said second manually operable means for maintaining a display of the measured value which was available when said second manually operable means was operated on said displaying means until said audible announcement has been generated.

9. A meter as set forth in claim 8 wherein said second manually operable means is a switch located on one of said measurement probes.

10. A means as set forth in claim 8 wherein said converting means comprises:
    a memory circuit responsive to said measured value for temporarily storing said measured value, said memory circuit periodically updating said stored measured value with a the current value of the measured signal; and
    a hold control circuit responsive to the operation of said second manually operable means for generating a hold signal when said manually operable means is operated, said memory circuit being responsive to said hold signal for discontinuing the periodic updating of said stored measured value so that the visual display remains constant.

11. A meter as set forth in claim 10 wherein said converting means comprises a voice circuit responsive to said stored measured value and responsive to spoken word information previously stored in said voice circuit for synthesizing electronic signals representing a spoken words conveying the value of said stored measured value, said voice circuit being operative during the time when said memory circuit is held.

12. A meter as set forth in claim 11 further comprising means responsive to said electronic signals for generating a release signal when said audible announcement has ceased, and wherein said hold control circuit is responsive to said release signal for generating a hold release signal, said memory circuit being responsive to said hold release signal for resuming periodic updating of said stored measured value.

13. A meter as set forth in claim 12 wherein said converting means further comprises an analog-to-digital convertor circuit responsive to said measured value for converting said measured value into a digital signal and wherein said memory circuit stores said digital signals.

14. A meter as set forth in claim 3 wherein said maintaining means is responsive to a signal stored in said storing for visually displaying stored signal.

15. A meter as set forth in claim 10 wherein said maintaining means comprises means responsive to said stored measured value for visually displaying said value.

* * * * *